(12) United States Patent
Melanson

(10) Patent No.: US 7,375,666 B2
(45) Date of Patent: May 20, 2008

(54) FEEDBACK TOPOLOGY DELTA-SIGMA MODULATOR HAVING AN AC-COUPLED FEEDBACK PATH

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/531,159

(22) Filed: Sep. 12, 2006

(65) Prior Publication Data

US 2008/0062022 A1    Mar. 13, 2008

(51) Int. Cl.
*H03M 3/00* (2006.01)

(52) U.S. Cl. ............. 341/143; 341/155; 341/172

(58) Field of Classification Search ........... 341/143, 341/155, 172
See application file for complete search history.

(56) References Cited

U.S. PATENT DOCUMENTS

| | | | | |
|---|---|---|---|---|
| 5,357,252 | A * | 10/1994 | Ledzius et al. | 341/143 |
| 5,471,209 | A * | 11/1995 | Sutterlin et al. | 341/143 |
| 5,977,899 | A * | 11/1999 | Adams | 341/145 |
| 5,982,316 | A * | 11/1999 | Shin | 341/143 |
| 6,201,835 | B1 | 3/2001 | Wang | 375/247 |
| 6,462,685 | B1 * | 10/2002 | Korkala | 341/131 |
| 6,473,019 | B1 * | 10/2002 | Ruha et al. | 341/143 |
| 6,608,581 | B1 * | 8/2003 | Semenov | 341/155 |
| 6,873,276 | B2 | 8/2003 | Yang et al. | |
| 6,670,902 | B1 | 12/2003 | Melanson et al. | |
| 6,674,381 | B1 * | 1/2004 | Gomez et al. | 341/143 |
| 6,744,392 | B2 * | 6/2004 | Melanson | 341/143 |
| 6,864,817 | B1 * | 3/2005 | Salvi et al. | 341/139 |
| 6,956,514 | B1 | 10/2005 | Melanson et al. | |
| 2002/0021238 | A1 * | 2/2002 | Noro et al. | 341/143 |
| 2004/0021594 | A1 * | 2/2004 | Melanson | 341/143 |
| 2004/0036634 | A1 * | 2/2004 | Level et al. | 341/77 |
| 2005/0012649 | A1 * | 1/2005 | Adams et al. | 341/143 |
| 2005/0184895 | A1 * | 8/2005 | Petersen et al. | 341/143 |

OTHER PUBLICATIONS

U.S. Appl. No. 11/388,397, filed Mar. 24, 2006, Melanson.
U.S. Appl. No. 11/531,144, filed Sep. 12, 2006, Melanson.

* cited by examiner

*Primary Examiner*—Jean B Jeanglaude
(74) *Attorney, Agent, or Firm*—Andrew M. Harris; Mitch Harris

(57) ABSTRACT

A feedback topology delta-sigma modulator having an AC-coupled feedback path reduces signal level in the loop filter, easing linearity requirements and reduces capacitor size requirements for the filter integration stages. The delta-sigma modulator includes a loop filter having multiple integrator stages, a quantizer, and a feedback network providing at least two feedback paths to corresponding integrators in the loop filter. In one aspect, only one of the feedback paths from the quantizer output is DC coupled, and at least one other of the feedback paths is DC-coupled, which reduces the signal levels in the loop filter integrators. In another aspect, at least one of the feedback paths from the quantizer is AC coupled, providing a similar result. The AC feedback path may be provided through a series-connected resistor and capacitor. The DC feedback path may be provided through a resistor, a switched-capacitor network, or may be a quantizer-controlled current source.

21 Claims, 6 Drawing Sheets

FEEDBACK TOPOLOGY DELTA-SIGMA MODULATOR HAVING AN AC-COUPLED FEEDBACK PATH

BACKGROUND OF THE INVENTION

1. Field of the Invention

The present invention relates generally to delta-sigma modulators/converters, and more specifically, to a delta-sigma modulator having reduced signal level in the loop filter that is provided by an AC-coupled feedback path.

2. Background of the Invention

Delta-sigma modulators are in widespread use in analog-to-digital converters (ADCs) and digital-to-analog converters (DACs), in which they provide very linear behavior and simple implementation due to the reduced number of bits used in the analog signal comparison. The delta-sigma modulator typically includes a loop filter and a quantizer connected in a feedback loop that combines the output of the quantizer with the input signal. The resulting operation provides noise shaping of the output of the quantizer, as determined by the loop filter characteristics. The path from the input of the modulator to the output of the quantizer (as also modified by the feedback), provides the signal transfer function (STF) and the loop around the quantizer loop filter provides the noise transfer function (NTF). Converters employing a delta-sigma modulator typically have a loop filter that optimizes the NTF to "shape" the "quantization noise" so that it is out of the signal band of interest, while providing a highly-linear response for the STF.

Originally, delta-sigma modulators for analog-to-digital converters (ADCs) employed single-bit feedback-only topologies, which have an advantage in that the STF is an all-pole response. However, the feedback topology modulator is disadvantageous in that each integrator output has an offset that compensates for the average DC value of the quantizer feedback provided to each integrator, raising the overall signal swing level required from each stage and leading to increased non-linearity. Also, the quantizer signal and quantization noise are provided to each integrator by the multiple feedback paths and are not attenuated as much in the feed-forward topology modulator, in which the quantizer output is introduced only at the input combiner. Thus, the feedback topology converter typically requires higher integrator time constants, and thus larger capacitors. Since the thermal noise floor of the loop filter is set by the input resistance, higher integrator time constants require larger capacitors, undesirably increasing required die area for implementation.

The higher signal levels present in the stages of a feedback-type modulator present several problems. First, in order to maintain the same level of harmonic distortion, the linearity of the loop filter stages must be higher than for a corresponding feed-forward design, since the signal levels through those stages are higher. In particular, the DC offset present at each stage of the feedback-type modulator contributes greatly to non-linearity. The capacitors used in the integrators must also be much more linear than for the feed-forward design for the same reason. Finally, for converters using multi-bit quantizer feedback, the capacitors must typically be larger in the feedback modulator design. Increasing the number of quantizer levels in the feed-forward design significantly reduces the integration gain/time constant requirement of the loop filter stages, whereas in the feedback topology, the decrease is not as significant.

Therefore, feed-forward topologies, and in particular, multi-bit feed-forward topologies, are almost always used in ADCs, due to the reduced noise and signal levels present in the integrator stages of the loop filter. The feed-forward topology has disadvantages in that there are zeros present in the STF. Out-of-band peaks in the response due to the presence of the zeros increase the converter noise floor by the aliasing of noise present at the peaks back into the signal pass-band.

Therefore, it would be desirable to provide a feedback topology delta-sigma modulator having reduced signal levels through the integrators, so that the noise performance advantages of the feedback topology can be had, without requiring large capacitors and highly-linear integrators and capacitors.

SUMMARY OF THE INVENTION

The above stated objectives are achieved in a delta-sigma modulator and method of operating a delta-sigma modulator. The delta-sigma modulator includes a quantizer, a loop filter including multiple integrator stages, and a feedback network providing at least two feedback paths from the output of the quantizer to corresponding inputs of integrators in the loop filter. In one aspect of the invention, only one of the feedback paths provides a direct current path from the output of the quantizer to a given one of the integrators in the loop filter. In another aspect of the invention, at least one of multiple feedback paths from the output of the quantizer to the input of a corresponding one of the integrators is AC coupled, that is, the direct current component of the quantizer output is blocked through that feedback path.

The loop filter may include feed-forward stages, in addition to at least two feedback stages. The AC coupled feedback path may be provided through a series-connected resistor-capacitor network from the output of the quantizer (or a multi-bit digital-to-analog converter receiving the output of the quantizer) to the input of the corresponding integrator. The other (DC) feedback path may be provided through a resistor, a switched-capacitor network, or may be a quantizer-controlled current source.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a delta-sigma modulation method and delta-sigma modulator. The delta-sigma modulator is a feedback-topology delta-sigma modulator having reduced integrator capacitor size requirements and/or reduced linearity requirements within the integrator stages. The DC offset at each integrator input is substantially equal to zero, provided by a novel architecture that uses AC-coupled (e.g., capacitively-coupled) feedback paths within the loop filter from the output of the modulator's quantizer. A solitary DC feedback path from the output of the quantizer, generally at the input signal combiner, can close the modulator feedback loop at DC, while at least one AC-coupled feedback path provides feedback to at least one other integrator stage, providing shaping of the response of the loop filter. The invention can alternatively be viewed as including at least one AC-coupled feedback path, i.e., a feedback path that blocks any DC component at the output of the quantizer from entering the corresponding integrator stage input.

Figure 1:
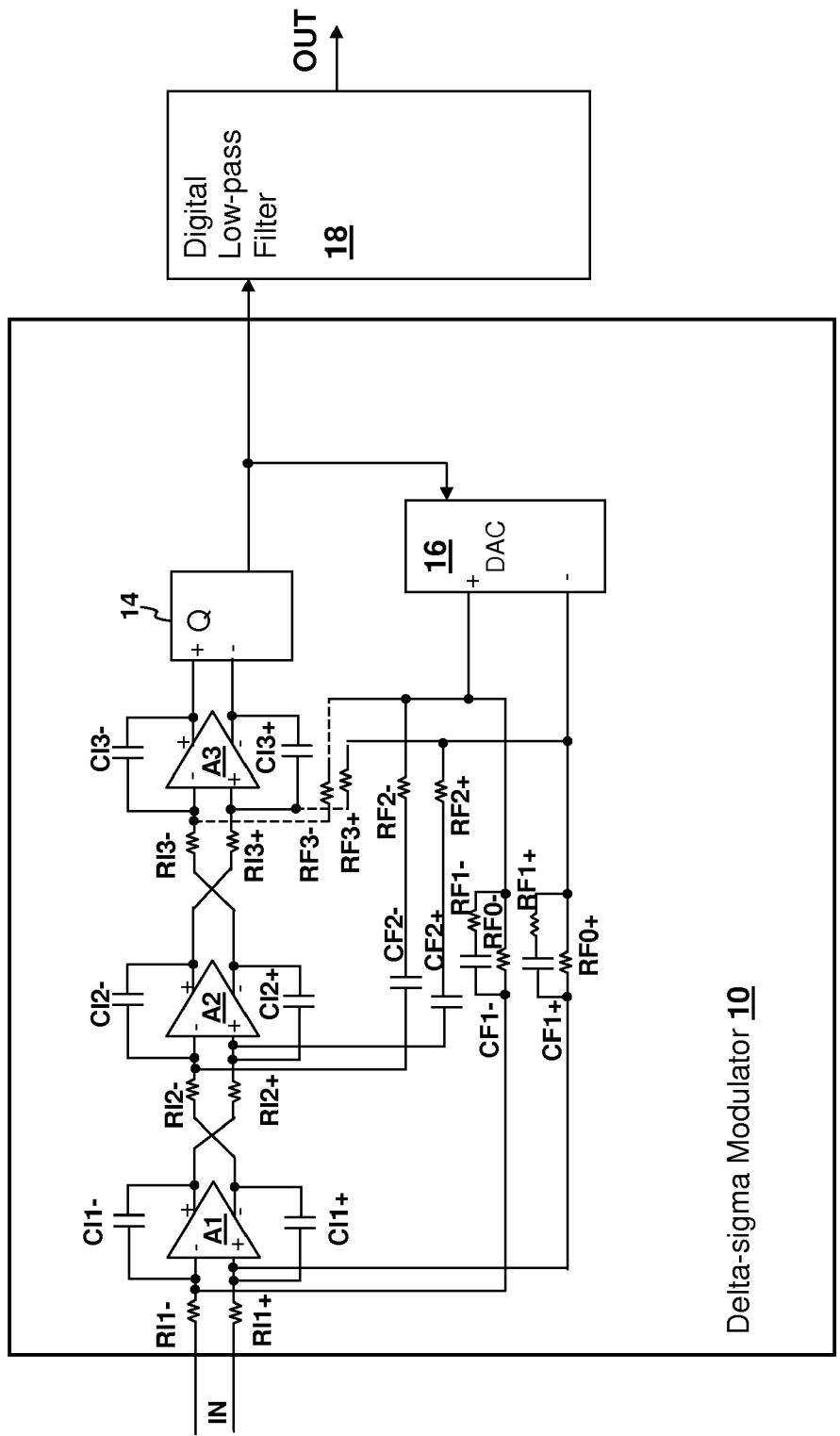
FIG. 1 is a circuit diagram of an analog-to-digital converter including a continuous-time delta-sigma modulator in accordance with an embodiment of the present invention.

Referring now to FIG. 1, a continuous-time delta-sigma modulator-based analog-to-digital converter (ADC) is shown. A noise shaping delta-sigma modulator 10 has a differential input IN and provides a noise-shaped output from a quantizer 14. The output from quantizer 14 is applied to a digital low-pass filter 18, thereby providing a digital output OUT corresponding to the analog input IN. Thus, the depicted circuit forms an ADC. However, the techniques of the present invention apply to any noise-shaping delta-sigma modulator in which it is desirable to reduce the size of the integrator capacitors and/or reduce the linearity requirements of the integrator stages.

Delta-sigma modulator 10 implements a noise shaper using a series of integrator stages that each receives an input signal from the previous stage. The first two integrator stages further receive feedback signals from a digital-to-analog converter (DAC) 16 that has an input that receives the output of quantizer 14 and provides feedback to the first two integrator stages formed by amplifiers A1 and A2 along with the associated resistor and capacitor elements. Amplifier A1 provides a differential first integrator stage, along with input resistors RI1−, RI1+ and integrating capacitors CI1−, CI1+. Amplifier A2 provides a differential second integrator stage, along with input resistors RI2−, RI2+ and integrating capacitors CI2−, CI2+. A final third integrator is implemented by amplifier A3 along with input resistors RI3−, RI3+ and integrating capacitors CI3−, CI3+. Quantizer 14 receives the output of the final integrator stage and provides the digital output that is filtered by digital low-pass filter 18 to provide the converter output value OUT and also provides the feedback signal for noise-shaping via DAC 16.

In the depicted embodiment, a differential DC feedback path is provided to the first integrator stage through resistors RF0+ and RF0−. However, all of the other noise-shaping feedback paths may be capacitively coupled and thus provide no DC component. The feedback path provided to the third integrator stage through resistors RF3+, RF3− is optional. The result is that the average DC value at the output of amplifier A1 is zero, due to the DC feedback path provided through resistors RF0+ and RF0−. The DC value at the output of amplifier A2 is also zero, as will be the DC value at the output of amplifier A3 if resistors RF3+, RF3− are removed, since there is no other DC level introduced at those integrator stages. Although the theoretical DC value at the outputs of the integrators is zero, it is understood that some offset will always be present at each integrator stages, in practice. However, such offset is generally much smaller than the offset introduced in a typical prior art feedback-topology modulator, which must have an offset at each integrator stage that is equal in magnitude and opposite in polarity to the average DC value of the feedback path provided to the next integrator stage.

The DC offset that is present at each stage in the typical feedback-topology modulator is an artifact that is inherent as the modulator stabilizes at its quiescent DC operating point after startup. Each integrator output will carry a DC offset that effectively biases-out the feedback average DC value to the next stage, preventing saturation of the next integrator by virtue of the DC transfer function that describes the overall feedback network, otherwise the modulator loop filter would not be stable at DC. By blocking all of the DC paths through the feedback network except for the feedback path to the first integrator stage, the noise-shaping transfer function is transformed so that the DC transfer function is unity throughout the loop filter. However, the advantages of the present invention are provided even when only the DC feedback path to the input of amplifier A2 is blocked, which causes the output of amplifier A1 to have a zero DC value. Since the first integrator stage in a delta-sigma modulator typically has the largest signal swing, due to the large amount of the quantizer output signal supplied to the input of the first integrator stage, removing required DC output offset provides substantial improvement in the linearity of the converter and/or relaxes the performance requirements for amplifier A1.

Capacitors CF1− and CF1+ along with resistors RF1− and RF1+ provide the AC component of the differential feedback path to the first integrator stage and capacitors CF2− and CF2+ along with resistors RF2− and RF2+ provide a second AC-coupled differential feedback path. Thus, in the depicted embodiment, one DC-coupled feedback path exists to the first integrator stage and one AC-coupled feedback path exists to the second integrator stage. (Capacitors CF1− and CF1+ provide additional AC feedback to the first integrator stage, but are not regarded as a separate AC-coupled feedback path as the term is used herein to describe feedback paths having only an AC component and no DC component.)

Figure 2A:
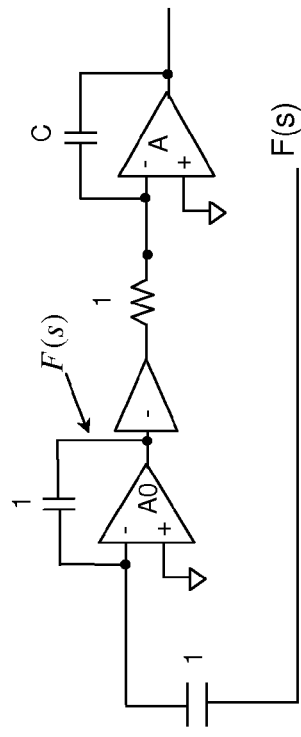
FIGS. 2A-2C are schematic diagrams illustrating transformations of a feedback network from a single-term DC-coupled feedback path to a two-term AC coupled feedback path.
Figure 2C:
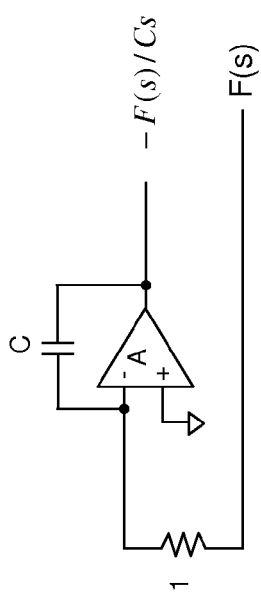
Figure 2B:
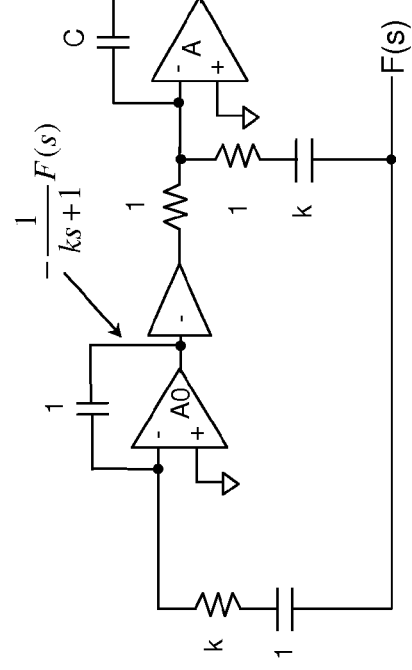

The relative values of capacitors CF1−, CF1+, CF2−, CF2+ and resistors RF1−, RF1+, RF2−, RF2+ with respect to DC path feedback resistors RF0− and RF0+ can be determined from a transformation of the traditional DC-only feedback-topology loop filter to the new topology represented in FIG. 1. Referring now to FIGS. 2A-2B, circuit equivalence of the AC-coupled feedback network of the present invention to a DC-coupled feedback network is illustrated. In FIG. 2A, an integrator formed by amplifier A, an integrating capacitor of value C and a normalized input resistor having a value of 1 integrates the feedback signal F(s) to yield an output signal −F(s)/Cs in the s-domain. Since the circuit is linear, superimposition applies and the input signal from prior integrator stages can be ignored (i.e., the input signal is set to zero).

FIG. 2B shows a transformed circuit having only AC-coupled feedback paths that provides an equivalent behavior to the circuit of FIG. 2A, except that at near zero-frequency (DC), the response will decrease. Amplifier A0 is the amplifier of the stage preceding amplifier A and forms an integrator having a normalized unit integrating capacitor and a first series RC network with resistance k and unit capacitance. The first series RC network provides an AC-coupled feedback path to the integrator stage preceding the stage for which the transformation of the previously DC-coupled path is being applied. A second series RC network having unit resistance and a capacitance of k is connected to the integrator stage where the transformation is being applied and formed by amplifier A with integrating capacitor of value C as present also in the circuit of FIG. 2A. The output of the first integrator stage is a signal represented by $-F(s)/(ks+1)$ in the s-domain and is inverted in application to the second integrator stage (as is implemented by the crossed connections between the integrators in delta-sigma modulator 10 of FIG. 1).

The output of the circuit of FIG. 2B can be expressed as $-1/Cs[(1/(ks+1))+(ks/(ks+1))]$, which yields the same result as the circuit of FIG. 2A: $-F(s)/Cs$. Effectively, the additional network provided to the input of the integrator stage previous to the stage for which feedback transformation is being applied provides a low-pass characteristic that cancels the high-pass characteristic introduced by the capacitor inserted in the feedback path at the stage for which the feedback being transformed. In other words, the feedback zero introduced by blocking the DC feedback path using a capacitor that would result in a pole in the converter noise-shaping response, is canceled by a pole introduced in the loop filter stage prior to the stage at which the DC feedback path is blocked. The pole is introduced by an additional series RC network coupled to the input of the prior stage integrator. For values of k approaching infinity, the circuit of FIG. 2B becomes that of FIG. 2A and for k=0, the circuit of FIG. 2B becomes that of FIG. 2C, in which the combination of two unit capacitors and amplifier A0 provides a unity response for frequencies away from DC, a topology that will be used in switched-capacitor implementations as illustrated below.

Figure 3A:
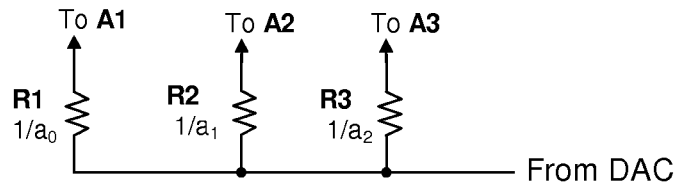
FIGS. 3A-3D are schematic diagrams depicting transformations of feedback networks as may be employed in delta-sigma modulators in accordance with embodiments of the present invention.

Referring now to FIGS. 3A-3D application of the above-described circuit transformation is illustrated. In FIG. 3A, a purely resistive feedback network is shown with resistors R1-R3 having normalized resistances $1/a_0$, $1/a_1$ and $1/a_2$ where $a_n$ is reflective of the feedback coefficients that determine the gain of the quantizer output as applied to each of the corresponding integrator stages of the filter, i.e. n=1 for the first stage, n=2 for the second and so forth. Determination of $a_n$ is a matter of design choice for the loop filter and is well-known in the art.

Figure 3B:
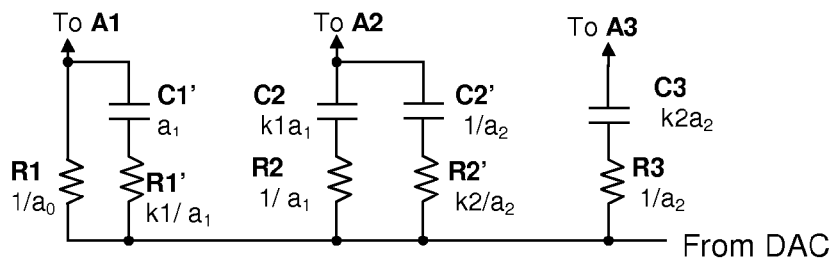

Referring now to FIG. 3B, a first transformed network is shown, having a DC feedback path provided only to the first integrator stage. As shown in FIG. 3B, the insertion of capacitors C2 and C3 in series with resistors R2 and R3 does not change the magnitude of the required resistance, but additional corresponding capacitors C1', C2' and additional resistors R1', R2' are included at the stage prior to the stages corresponding to capacitors C2 and C3 to cancel the feedback zeros introduced by capacitors C2 and C3. The normalized values of additional components C2, C1' and R1' associated with resistor R2 are set by a first constant k1 and the normalized values of the additional components C2',R2' and C3 associated with resistor R3 are set by a second constant k2 as shown. k1 and k2 control the locations of the additional pole-zero pairs introduced by the additional components for each stage.

Figure 3C:
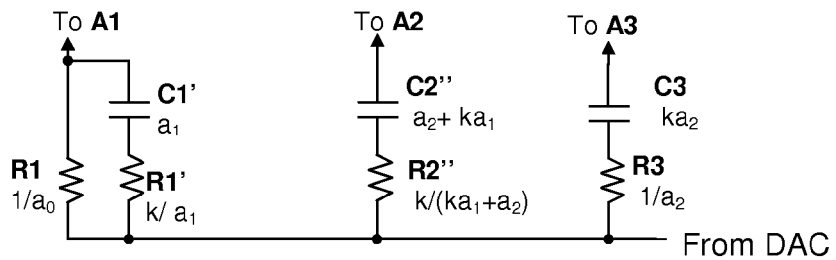
Figure 3D:
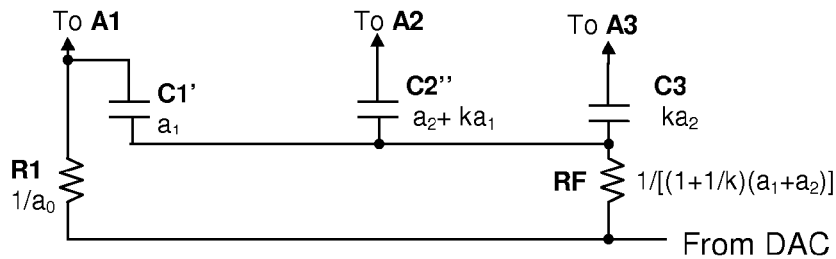

FIG. 3C illustrates a further transformation that then reduces the number of components required by combining the network formed by capacitor C2 and resistor R2 with the network formed by capacitor C2' and resistor R2' into a single series RC network formed by capacitor C2" an R2". Constants k1 and k2 are set to a single constant k, for convenience. Finally, FIG. 3D shows a network that combines the resistances for all of the AC-coupled portion of the feedback paths into one resistor RF, having a value $1/[(1+1/k)(a_1+a_2)]$. Capacitor C3 has a final value $ka_2$, capacitor C2" has a final value $a_2+ka_1$, and capacitor C1' a final value of $a_1$.

Since any of the above-described networks depicted in FIGS. 3A-3D provide the same overall feedback transfer function for the modulator, any of the networks depicted in FIGS. 3B-3D may be used to provide operation of the modulator with zero DC feedback components at each of the stages after the first modulator stage. Other variations are possible, such as applying DC feedback only at another stage, which will not provide the desirable effect of theoretically eliminating DC offset at the outputs of all of the integrators. However, the DC offset may be reduced for some improvement of linearity and/or reduction of capacitor size. Another possibility is providing DC through more than one, but less than all of the feedback paths, which again will not provide the desired zero-offset result at all integrator stage outputs.

Figure 4:
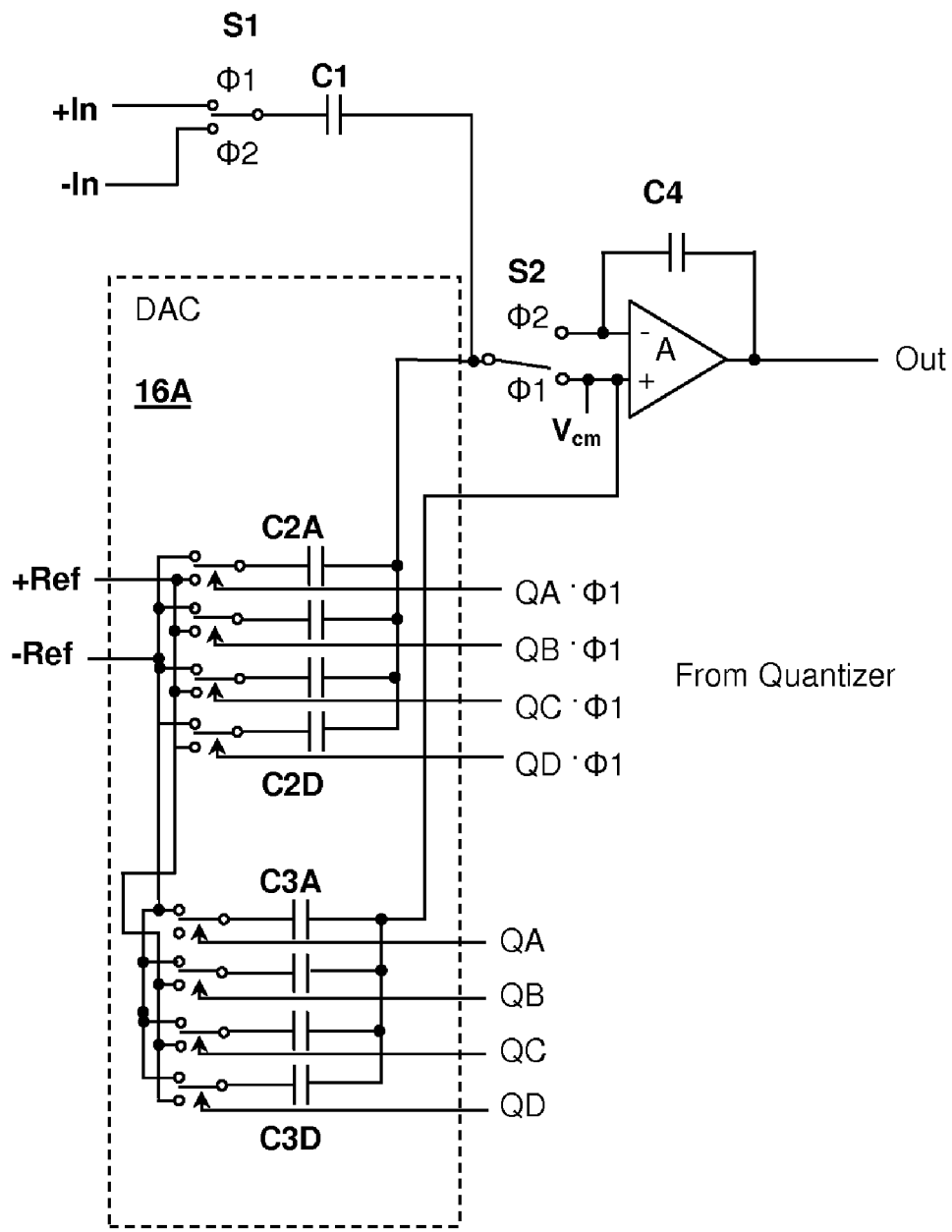
FIG. 4 is a circuit diagram depicting a delta-sigma modulator stage as may be employed in a discrete-time delta-sigma modulator in accordance with an embodiment of the present invention.

Referring now to FIG. 4, application of the techniques of the present invention in discrete-time delta-sigma modulators is illustrated in a delta-sigma modulator integrator stage. In the depicted integrator stage, amplifier A and capacitor C4 form an integrator in combination with the switched-capacitor input network formed by switch S1 and switch S2. A feedback signal is supplied from digital to analog converter DAC 16A from two sets of switched capacitor banks: capacitors C2A-C2D and capacitors C3A-C3D, along with their associated switches, as shown. DAC 16A operates by using the quantizer digital output levels QA-QD to select among (or combinations of) capacitors C2A-C2D and capacitors C3A-C3D. Whether a single capacitor or combination is selected is dependent upon whether DAC 16A is illustrating a 2-bit DAC or a 4-bit DAC. If DAC 16A is illustrating a 2-bit DAC, then signals QA-QD are the outputs of a 4-comparator string in DAC 16A and capacitors C2A-C2D and capacitors C3A-C3D are individually selected (one in each bank) and equal in capacitance. If DAC 16A is illustrating a 4-bit DAC, then signals QA-QD are the outputs of a logic block that combines the output of a 16-comparator string in DAC 16A and capacitors C3A-C3D are selected in a combination for each bank and form a C2C network according to powers-of-two of the smallest capacitance.

The capacitor bank formed by capacitors C2A-C2D and the input circuit formed by switch S1 and capacitor C1 operate according to conventional switched-capacitor operation. Two clock phases $\Phi1$ and $\Phi2$ alternatively apply the input signals to one terminal of capacitor C1, while the other terminal is applied to the input of amplifier A in alternation with the common mode reference supply $V_{cm}$. The feedback signal generated from DAC reference voltages +Ref and −Ref applied through capacitor bank formed by capacitors C2A-C2D is also conventional in that clock phase $\Phi1$ intermittently applies the charge coupled from the reference voltage via capacitors C2A-C2D as selected by digital signals QA-QD received from the quantizer and the charge is applied to amplifier A by switch S1 during clock phase $\Phi2$. Therefore, capacitor C1 and capacitors C2A-C2D act as resistances, as is well known in the art.

However, the capacitor bank formed by capacitors C3A-C3D is not switched by a clock phase and capacitors C3A-C3D are only statically selected by digital signals QA-QD for each conversion cycle and any charge applied from DAC reference voltages +Ref and −Ref by capacitors C3A-C3D is due to changes in the values of digital signals QA-QD. Therefore, capacitors C3A-C3D act as capacitors that apply the AC-coupled feedback of the present invention from DAC 16A to the integrator formed by the balance of the circuit, and are reflective of the behavior of the model circuit of FIG. 2C described above. Therefore, the discrete-time integrator stage shown can be applied as shown above in the place of the integrator stages having both AC and DC feedback paths. For stages having no DC feedback path, e.g., all stages subsequent to the first integrator stage in the embodiment illustrated in FIG. 1, the capacitor bank formed by capacitors C2A-C2D is deleted, leaving only the AC-coupled feedback path.

Figure 5:
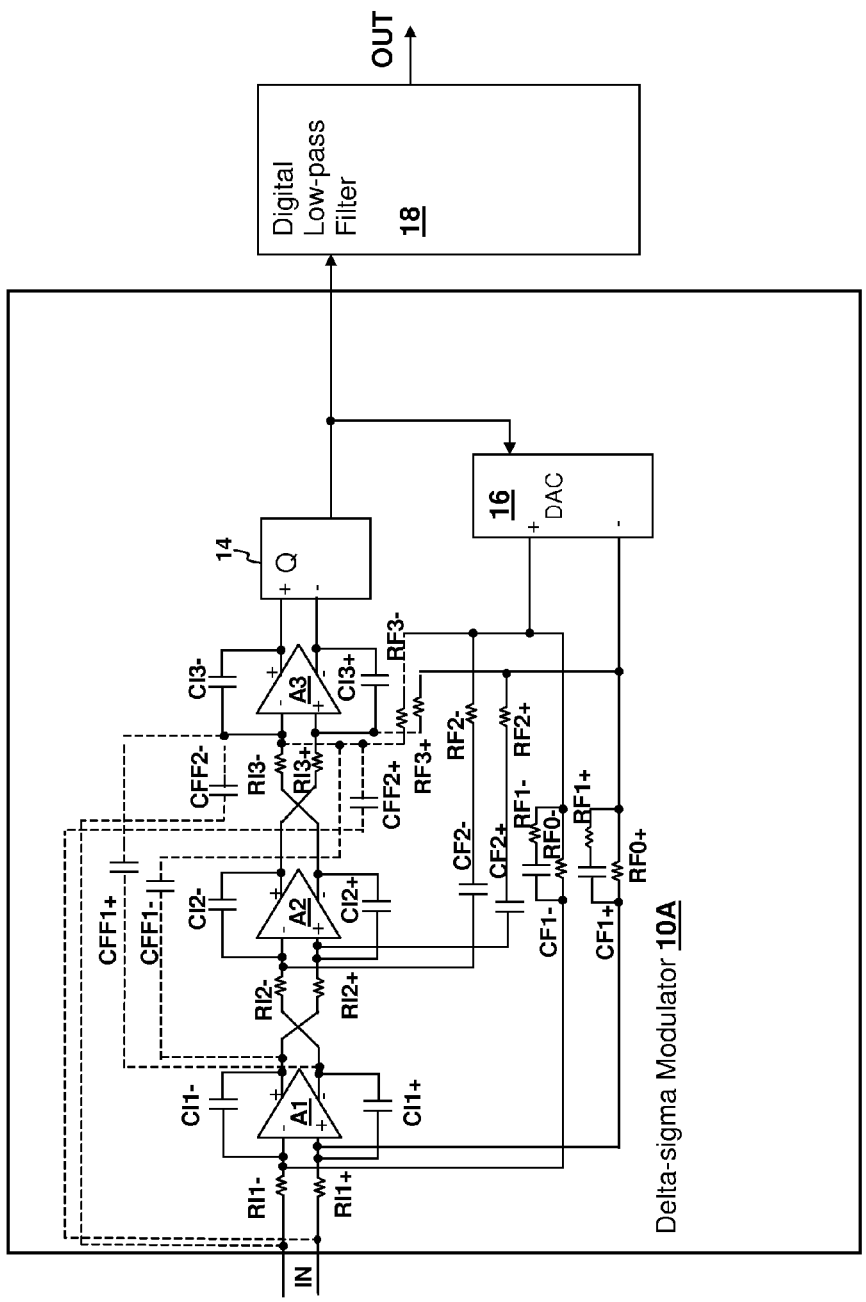
FIG. 5 is a circuit diagram depicting a delta-sigma modulator in accordance with another embodiment of the present invention.

Referring now to FIG. 5, another delta-sigma modulator 10A in accordance with an embodiment of the present invention is shown. The depicted embodiment is similar to that of FIG. 1, and therefore only differences between the embodiments will be described below. Delta-sigma modulator 10A includes both feedback paths and at least one feed-forward path, providing a third-order circuit with an additional degree(s) of design freedom in the transfer function due to the additional feed-forward path(s). Two such feed-forward paths provided by capacitors are illustrated, either of which can provide the additional feed-forward path or both may be used in combination to provide two additional feed-forward paths. In the first example, capacitors CFF2− and CFF2+ are added to the circuit of FIG. 1. Because capacitors CFF2− and CFF2+ act as "differentiators" in their input signal path as applied directly to the summing nodes of amplifier A3, the signal provided through capacitors CFF2− and CFF2+ is rotated +90 degrees with respect to the state diagram and the effect is that of adding a signal to the output of the final integrator stage from the input of the delta-sigma modulator. Alternatively, or in combination, capacitors CFF1− and CFF1+ can be added to the circuit of FIG. 1, which couple signals from the output of the first integrator stage and effectively sum that signal with the output of the third integrator stage, since the differentiating action of capacitors CFF1− and CFF1+ effectively refers the signal to the output of the third integrator stage. Applying signals from capacitors CFF1−, CFF1+ and capacitors CFF2−, CFF2+ at the input to the third integrator stage, rather than resistive feed-forward paths applied at the outputs of the third integrator stage, is advantageous in that no summing network is required at the input of the quantizer. The summing is made at the input of amplifier A3 and is referred to the output of amplifier A3 by virtue of the differentiating action of capacitors CFF1−, CFF1+ and capacitors CFF2−, CFF2+.

Figure 6:
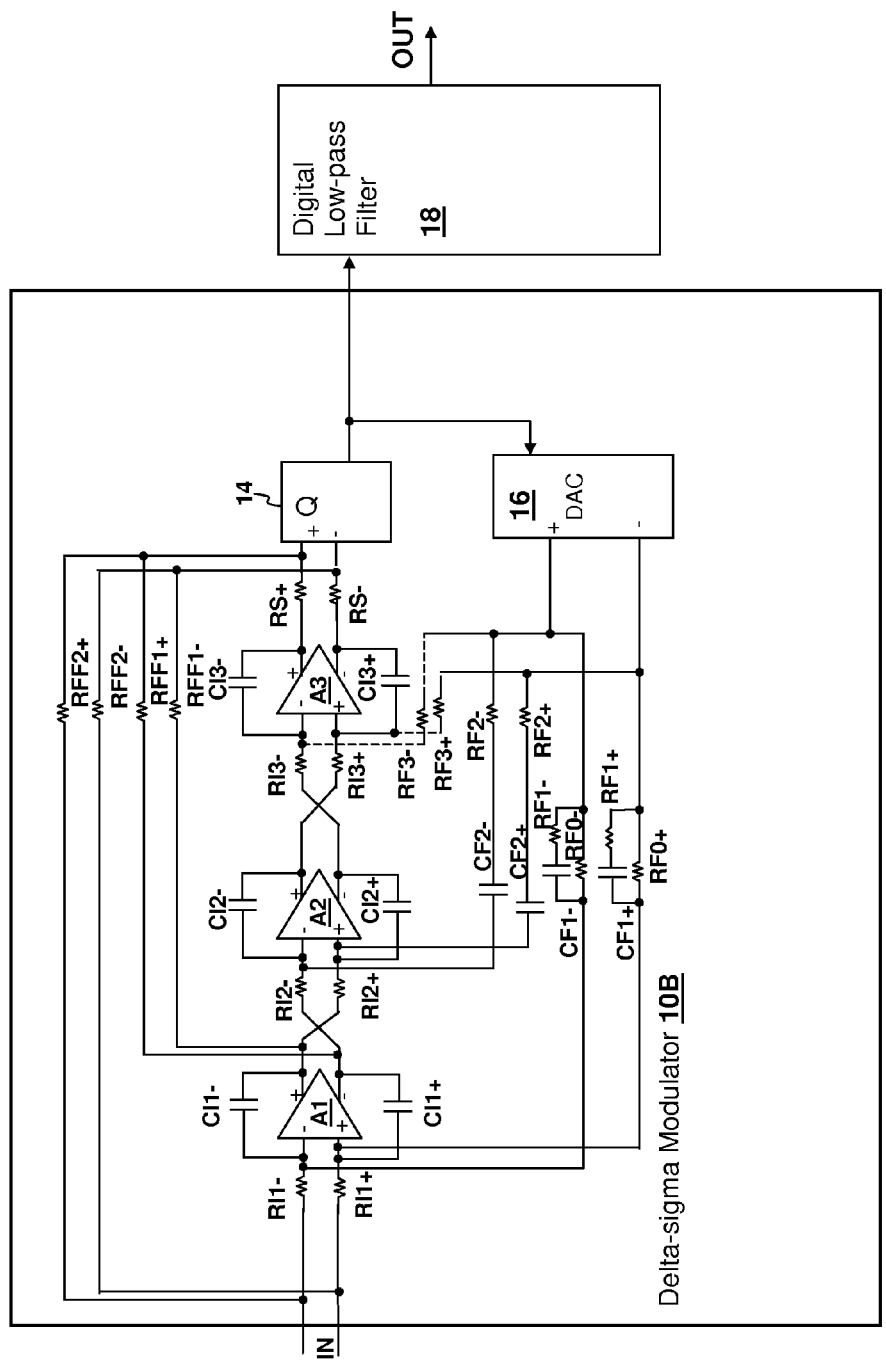
FIG. 6 is a circuit diagram depicting a delta-sigma modulator in accordance with yet another embodiment of the present invention.

Referring now to FIG. 6, another delta-sigma modulator 10B in accordance with an embodiment of the present invention is shown. The depicted embodiment is similar to that of FIG. 1, and therefore only differences between the embodiments will be described below. Delta-sigma modulator 10B includes both the feedback paths of FIG. 1 and additional feed-forward paths, provided by combining signals provided through resistors RFF2+ and RFF2− from the input of the loop filter, signals provided through resistors RFF1+ and RFF1− from the output of the first integrator stage, and the output of the third integrator stages provided through resistors RS+ and RS−. The combined signal is providing to the input of quantizer 14. Thus the circuit depicted in FIG. 6, provides the functionality of the circuit depicted in FIG. 5, but the feed-forward paths are applied in the conventional manner, using summation of a DC coupled paths from the input of the loop filter and the output of the first integrator stage to the input of the quantizer. The feed-forward term provided by resistors RFF2+ and RFF2− corresponds to the term provided by capacitors CFF2+ and CFF2− in the circuit of FIG. 5, and the term provided by resistors RFF1+ and RFF1− corresponds to the term provided by capacitors CFF1+ and CFF1−. The AC-coupled feedback paths are introduced as described above with reference to FIG. 1.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A delta-sigma modulator, comprising:
a loop filter comprising a plurality of cascaded integrator stages;
a quantizer having an input coupled to an output of a final one of said plurality of cascaded integrator stages; and
a feedback network providing feedback from an output of said quantizer to inputs of at least two of said plurality of integrator stages through a plurality of corresponding feedback paths, and wherein only one of said feedback paths provides a direct current feedback path from said output of said quantizer to a corresponding given one of said at least two integrator stages.

2. The delta-sigma modulator of claim 1, wherein said only one feedback path is a feedback path from said output of said quantizer to a first one of said at least two integrator stages.

3. The delta-sigma modulator of claim 2, wherein said feedback network further provides only one other feedback path to a second one of said at least two integrator stages.

4. The delta-sigma modulator of claim 1, wherein said feedback network provides feedback to each of said inputs of said plurality of cascaded integrator stages.

5. The delta-sigma modulator of claim 1, wherein said feedback network comprises:
a resistor coupling said output of said quantizer to said given integrator stage for providing said direct current feedback path; and
at least one series RC circuit consisting of a resistor connected in series with a capacitor for providing at least one other feedback path to at least one other one of said at least two integrators.

6. The delta-sigma modulator of claim 1, wherein said given integrator stage is a first one of said plurality of cascaded integrator stages, and wherein said at least one other one of said at least two integrators is a second one of said plurality cascaded integrator stages having an input coupled to an output of said first one of said plurality of cascaded integrator stages.

7. The delta-sigma modulator of claim 1, further comprising at least one feed-forward path coupling an input of said loop filter to an input of said quantizer.

8. The delta-sigma modulator of claim 1, further comprising a summer for coupling said output of said final one of said integrator stages and having a feed-forward input for receiving said feed-forward path.

9. The delta-sigma modulator of claim 8, wherein said feed-forward input of said summer is DC-coupled to said input of said loop filter.

10. The delta-sigma modulator of claim 8, wherein said feed-forward input of said summer is AC-coupled to an output of a first one of said plurality of integrator stages by a capacitor, whereby a differentiating action of said capacitor refers said feed-forward input of said summer to said input of said loop filter.

11. The delta-sigma modulator of claim 7, wherein said feed-forward path is provided by a capacitor that couples said input of said loop filter to an input of said final one of said plurality of integrator stages, whereby a differentiating action of said capacitor refers said input of said final integrator stage to said output of said final integrator stage.

12. The delta-sigma modulator of claim 1, wherein said plurality of integrator stages are switched-capacitor integrator stages, and wherein another one of said plurality of feedback paths is provided through a capacitor selected in conformity with an output of said quantizer.

13. A delta-sigma modulator, comprising:
a loop filter comprising a plurality of cascaded integrator stages;
a quantizer having an input coupled to an output of a final one of said plurality of cascaded integrator stages; and
a feedback network providing feedback from an output of said quantizer to said loop filter through at least one feedback path, and wherein at least one of said feedback paths is an feedback path blocking direct current signals and passing only time-varying signals from said output of said quantizer to a corresponding one of said integrator stages.

14. The delta-sigma modulator of claim 13, further comprising a capacitor coupled in series with an output of said quantizer to an input of said loop filter.

15. The delta-sigma modulator of claim 13, wherein said at least one feedback path provides a feedback path to a second one of said plurality of integrator stages.

16. The delta-sigma modulator of claim 13, wherein said feedback network provides feedback paths to each of said inputs of said plurality of cascaded integrator stages, and wherein at least one of said feedback paths is a direct-current path.

17. The delta-sigma modulator of claim 13, further comprising at least one feed-forward path coupling an input of said loop filter to an input of said quantizer.

18. The delta-sigma modulator of claim 17, wherein said feed-forward path is provided by a capacitor that couples said input of said loop filter to an input of said final one of said plurality of integrator stages, whereby a differentiating action of said capacitor refers said input of said final integrator stage to said output of said final integrator stage.

19. The delta-sigma modulator of claim 13, wherein said plurality of integrator stages are switched-capacitor integrator stages, and wherein another one of said plurality of feedback paths is provided through a capacitor selected in conformity with an output of said quantizer, wherein said capacitor is not interrupted by a clock of said switched-capacitor integrator stages.

20. A method of operating a delta-sigma modulator, comprising:
noise-shaping an input and feedback signals with a loop filter formed by a plurality of cascaded integrator stages;
quantizing a result of said noise-shaping to provide an output signal; and
providing feedback of said quantizing to said noise-shaping as said feedback signals, wherein said providing provides feedback of direct current values to only one input of said plurality of cascaded integrator stages.

21. A method of operating a delta-sigma modulator, comprising:
noise-shaping an input and feedback signals with a loop filter formed by a plurality of cascaded integrator stages;
quantizing a result of said noise-shaping to provide an output signal; and
providing feedback of said quantizing to said noise-shaping as said feedback signals, wherein said providing blocks feedback of direct current values in at least one feedback path to at least one corresponding one of said plurality of cascaded integrator stages.

* * * * *